(12) United States Patent
Jung et al.

(10) Patent No.: US 10,948,446 B2
(45) Date of Patent: Mar. 16, 2021

(54) CHEMIRESISTOR GAS SENSOR USING MXENE AND THE MANUFACTURING METHOD THEREOF

(71) Applicants: KOREA ADVANCED INSTITUTE OF SCIENCE AND TECHNOLOGY, Daejeon (KR); DREXEL UNIVERSITY, Philadelphia, PA (US)

(72) Inventors: Hee-Tae Jung, Daejeon (KR); Seon Joon Kim, Daejeon (KR); Hyeong-Jun Koh, Daejeon (KR); Yury Gogotsi, Ivyland, PA (US)

(73) Assignees: KOREA ADVANCED INSTITUTE OF SCIENCE AND TECHNOLOGY, Daejeon (KR); DREXEL UNIVERSITY, Philadelphia, PA (US)

( * ) Notice: Subject to any disclaimer, the term of this patent is extended or adjusted under 35 U.S.C. 154(b) by 383 days.

(21) Appl. No.: 15/759,214

(22) PCT Filed: Jan. 16, 2018

(86) PCT No.: PCT/KR2018/000733
§ 371 (c)(1),
(2) Date: Mar. 10, 2018

(87) PCT Pub. No.: WO2019/124625
PCT Pub. Date: Jun. 27, 2019

(65) Prior Publication Data
US 2019/0391099 A1    Dec. 26, 2019

(30) Foreign Application Priority Data

Dec. 22, 2017  (KR) .......................... 10-2017-0178063

(51) Int. Cl.
| | | |
|---|---|---|
| *G01N 27/12* | (2006.01) | |
| *G01N 27/407* | (2006.01) | |
| *G01N 27/404* | (2006.01) | |

(52) U.S. Cl.
CPC ......... *G01N 27/125* (2013.01); *G01N 27/407* (2013.01); *G01N 27/404* (2013.01)

(58) Field of Classification Search
CPC .. G01N 27/125; G01N 27/127; G01N 27/308; G01N 27/404; G01N 27/4045; G01N 27/407; G01N 27/4074
See application file for complete search history.

(56) References Cited

U.S. PATENT DOCUMENTS

2007/0138440 A1* 6/2007 Chan ........................ H01B 1/22
252/500

FOREIGN PATENT DOCUMENTS

| KR | 1020170036507 A | 4/2017 |
|---|---|---|
| KR | 1020170093041 A | 8/2017 |
| KR | 1020170102768 A | 9/2017 |

OTHER PUBLICATIONS

Lee et al, Room Temperature Gas Sensing of Two-Dimensional Titanium Carbide (MXene), Sep. 2017, ACS Applied Material & Interfaces, vol. 9, Issue 42, pp. 37184-37190 (Year: 2017).*

(Continued)

*Primary Examiner* — Benjamin R Whatley
*Assistant Examiner* — Austin Q Le
(74) *Attorney, Agent, or Firm* — STIP Law Group, LLC (57) ABSTRACT

This invention relates to a chemiresistor gas sensor using MXene and a method of manufacturing the same, wherein the chemiresistor gas sensor, manufactured in a manner in which a $Ti_3C_2T_x$ MXene thin film is formed and transferred onto a sensor substrate, can exhibit good response and sensitivity.

8 Claims, 8 Drawing Sheets

(56) References Cited

OTHER PUBLICATIONS

Hantanasirisakul et al "Fabrication of Ti3C2Tx MXene Transparent Thin Films with Tunable Optoelectronic Properties" Apr. 2016, vol. 2, Issue 6, p. 1600050 (Year: 2016).*

Miranda et al "Electronic properties of freestanding Ti3C2Tx MXene monolayers" Jan. 2016, Applied Physics Letters, vol. 108, Issue 3, p. 108 (Year: 2016).*

Zhu et al, "Recent advance in MXenes: A promising 2D material for catalysis, sensor and chemical adsorption", Oct. 2017, Coordination Chemistry Reviews, vol. 352, pp. 306-327 (Year: 2017).*

Eunji Lee et al, Room Temperature Gas Sensing of Two-Dimensional Titanium Carbide (MXene), ACS Applied Materials & Interfaces, Sep. 27, 2017, vol. 9, pp. 37184-37190, ACS Publications, Washington DC, USA.

Office action from Korean Intellectual Property Office of 10-2017-0178063, dated Mar. 21, 2019.

E. Lee; Room Temperature Gas Sensing of Two-Dimensional Titanium Carbide (MXene); ACS Appl. Mater. Interfaces 2017, 9, pp. 37184-37190; American Chemical Society; USA.

* cited by examiner

CHEMIRESISTOR GAS SENSOR USING MXENE AND THE MANUFACTURING METHOD THEREOF

CROSS-REFERENCE TO RELATED APPLICATIONS

This application is the U.S. National Phase under 35 U.S.C. § 371 of International Application No. PCT/KR2018/000733 filed on Jan. 16, 2018, which in turn claims the benefit of Korean Application No. 10-2017-0178063, filed on Dec. 22, 2017, the disclosures of which are incorporated by reference into the present application.

TECHNICAL FIELD

The present invention relates to a chemiresistor gas sensor using MXene and the manufacturing method thereof, and more particularly to a chemiresistor-type gas sensor having very high sensitivity using MXene having excellent electrical conductivity as a channel material and a method of manufacturing the same.

BACKGROUND ART

Sensitively detecting very low concentrations of molecules is regarded as very important in the fields of detection of toxic substances, detection of pollutants, early diagnosis of diseases, and the like. In particular, for the early diagnosis of diseases, volatile organic compounds (VOCs) such as acetone and ethanol from human exhalation must be able to be precisely detected at a concentration of ppb (parts per billion).

In order to sensitively detect the molecules, a gas sensor (resistive gas sensor), which operates based on changes in electrical resistance, is widely utilized, and such a gas sensor is typically exemplified by a chemiresistor-type gas sensor.

In order to sensitively detect very low concentrations of molecules by such sensors, both of low electrical noise, which appears at high electrical conductivity, and a high electrical signal, which appears on rich surface functional groups, have to be fulfilled at the same time.

Although various materials have conventionally been utilized for channels for gas sensors, the above two requirements are always in a trade-off relationship, making it difficult to realize sensors having high sensitivity.

Meanwhile, MXene (a transition metal carbide material) is a 2D nano material comprising double elements of a heavy metal atom such as titanium (Ti) and a carbon (C) atom, with a 2D planar structure having a thickness of 1 nm and a length of ones of m. MXene has advantages such as simple preparation and low cost compared to conventional nano materials, and contains many hydrophilic groups (an atomic group that is highly compatible with water) on the surface thereof, making it easy to realize dispersion in a solvent and to prepare a polymer composite, and also, MXene having high electrical conductivity may be favorably applied to various films, coating products, and the like, requiring electrical conductivity.

Unlike existing materials, MXene is characterized in that the entire surface thereof is covered with hydrophilic functional groups and also excellent metallic conductivity is manifested, and is thus expected to manifest outstanding performance as a material for a gas sensor channel.

Therefore, the present invention is aimed to provide a method of manufacturing a gas sensor, which is able to detect very low concentrations of VOCs using MXene and may exhibit very high sensitivity compared to existing materials.

The related art in the field to which the present invention belongs will be briefly described, and then the technical aspects by which the present invention seeks to differentiate itself from the related art will also be described below.

Specifically, Korean Patent Application Publication No. 10-2017-0102768 (Sep. 12, 2017) discloses a method of manufacturing a 2D MXene thin film and a method of fabricating an electronic device using the same, the method of manufacturing the MXene thin film including treating bulk $M_2AlC$ MAX-phase (M representing a transition metal) with hydrofluoric acid to thus form bulk $M_2C(OH)_xF_y$ MXene (0<x≤2, 0<y≤2, 0<x+y≤2), and performing annealing using the bulk $M_2C(OH)_xF_y$ MXene to thus form an $M_2CO_x$ MXene thin film.

Also, Korean Patent Application Publication No. 10-2017-0093041 (Aug. 14, 2017) discloses an MXene ferrite composite and a method of preparing the same, and more particularly an MXene ferrite composite having improved electrical conductivity suitable for use as electromagnetic wave absorbers and a method of preparing the same, which may be applied to a transparent conductive thin film for a sensor.

Also, Korean Patent Application Publication No. 10-2017-0036507 (Apr. 3, 2017) discloses a method of manufacturing an MXene nanosheet, and more particularly a method of manufacturing an MXene nanosheet, the surface of which is not functionalized with functional groups such as O, OH, F, etc.

The related documents as above disclose the manufacture of the MXene thin film, ferrite, nanosheet, and the like, which may be applied to the conductive thin film for a sensor, but in order to serve as a gas sensor, the formation of an MXene thin film on a sensor substrate is not mentioned, and thus it is difficult to manufacture a chemiresistor-type gas sensor having high sensitivity based on the technology disclosed in the aforementioned related documents alone.

DISCLOSURE

Technical Problem

Accordingly, the present invention has been made keeping in mind the problems encountered in the related art, and the present invention is intended to provide a gas sensor using MXene, having excellent electrical conductivity, as a channel material and a method of manufacturing the same.

In addition, the present invention is intended to provide a technique for transferring an MXene thin film onto a sensor substrate in order to manufacture a chemiresistor gas sensor.

Technical Solution

An embodiment of the present invention provides a chemiresistor gas sensor, comprising: a substrate; an MXene thin film formed on the substrate; and electrodes respectively formed on both sides of the MXene thin film.

Also in this embodiment, the MXene thin film may be a $Ti_3C_2T_x$ MXene thin film.

Also in this embodiment, the functional group of the MXene thin film may include oxygen (O), a hydroxyl ion (OH), and fluorine (F).

Also in this embodiment, the substrate may be composed of a material selected from the group consisting of glass, Si/SiO$_2$, PET, PDMS, polyimide (PI) and Ecoflex.

Also in this embodiment, the chemiresistor gas sensor may be used for sensing at least one gas selected from the group consisting of a volatile organic compound (VOC), nerve gas, explosive gas, and food gas.

Also in this embodiment, the limit of detection (LOD) enabling gas detection in the chemiresistor gas sensor may be 50 ppb, and furthermore, the signal-to-noise ratio (SNR) thereof may be 230 or more for acetone, 345 or more for ethanol, 150 or more for ammonia, and 170 or more for propanol.

In addition, another embodiment of the present invention provides a method of manufacturing a chemiresistor gas sensor using MXene, comprising: forming a Ti$_3$C$_2$T$_x$ MXene aqueous solution by dispersing Ti$_3$C$_2$T$_x$ MXene in H$_2$O, forming a Ti$_3$C$_2$T$_x$ MXene thin film from the Ti$_3$C$_2$T$_x$ MXene aqueous solution, and transferring the Ti$_3$C$_2$T$_x$ MXene thin film formed on an anodized aluminum oxide membrane onto a sensor substrate.

Also, in this embodiment, the forming the Ti$_3$C$_2$T$_x$ MXene thin film may be performed through at least one of a vacuum filtration process, a spin-coating process, and a spray-coating process.

In the present invention, the transferring the Ti$_3$C$_2$T$_x$ MXene thin film onto the sensor substrate may include floating the anodized aluminum oxide membrane having the Ti$_3$C$_2$T$_x$ MXene thin film formed thereon on the surface of a NaOH aqueous solution; allowing the anodized aluminum oxide membrane to be removed from the anodized aluminum oxide membrane having the Ti$_3$C$_2$T$_x$ MXene thin film formed thereon so as to float the Ti$_3$C$_2$T$_x$ MXene thin film alone on the surface of the NaOH aqueous solution; neutralizing the NaOH aqueous solution; and fixing the sensor substrate to the bottom of a container, placing the Ti$_3$C$_2$T$_x$ MXene thin film on the substrate while gradually lowering the surface of the NaOH aqueous solution, and then performing drying.

Advantageous Effects

According to the present invention, in the chemiresistor gas sensor using MXene and the method of manufacturing the same, a chemiresistor gas sensor is manufactured by transferring an MXene thin film, formed using Ti$_3$C$_2$T$_x$ MXene, having excellent electrical conductivity, as a channel material, onto a sensor substrate. The gas sensor thus manufactured enables sensing of typical VOC candidates in the concentration range of 100 ppb or less, and can exhibit a signal-to-noise ratio (SNR), which indicates sensitivity, at least tens of times as high as other 2D materials.

BEST MODE

Hereinafter, a detailed description will be given of a method of manufacturing a chemiresistor gas sensor using MXene according to preferred embodiments of the present invention with reference to the appended drawings so that the present invention may be easily carried out by those skilled in the art to which the present invention belongs.

In the following description of preferred embodiments of the present invention, detailed descriptions of known functions and components incorporated herein will be omitted when the same may make the subject matter of the present invention unclear.

Furthermore, descriptions of embodiments and drawings of the present invention disclosed herein are only for the purpose of illustration of the preferred embodiments of the present invention, and are not intended to represent all of the technical ideas of the present invention, and thus a variety of equivalents and modifications able to substitute therefor may be provided at the point of time of filing of the present invention.

The present invention pertains to a chemiresistor gas sensor using MXene and a method of manufacturing the same, and to a chemiresistor gas sensor having good response and sensitivity manufactured in a manner in which a Ti$_3$C$_2$T$_x$ MXene thin film is formed and then transferred onto a sensor substrate. In Ti$_3$C$_2$T$_x$, x is greater than 0 and less than 2.

For reference, a chemiresistor type is a sensor type for detecting gas depending on changes in electrical resistance, and in such a gas sensor, the response (signal) is represented by the extent of change in electrical resistance. For example, when a reference gas flows, the resistance of the MXene thin film is 100 ohm, and when a measurement gas is added, the resistance of the MXene thin film is 110 ohm. Here, a response (signal) is 10%.

Also, apart from the response, sensitivity is measured based on a signal-to-noise ratio (SNR) obtained by dividing the response (signal) by electrical noise (noise). Here, electrical noise refers to the width at which resistance changes under the conditions that the reference gas flows and that there is no change in the gas flow, and the higher the signal-to-noise ratio, the higher the sensitivity.

Figure 1:
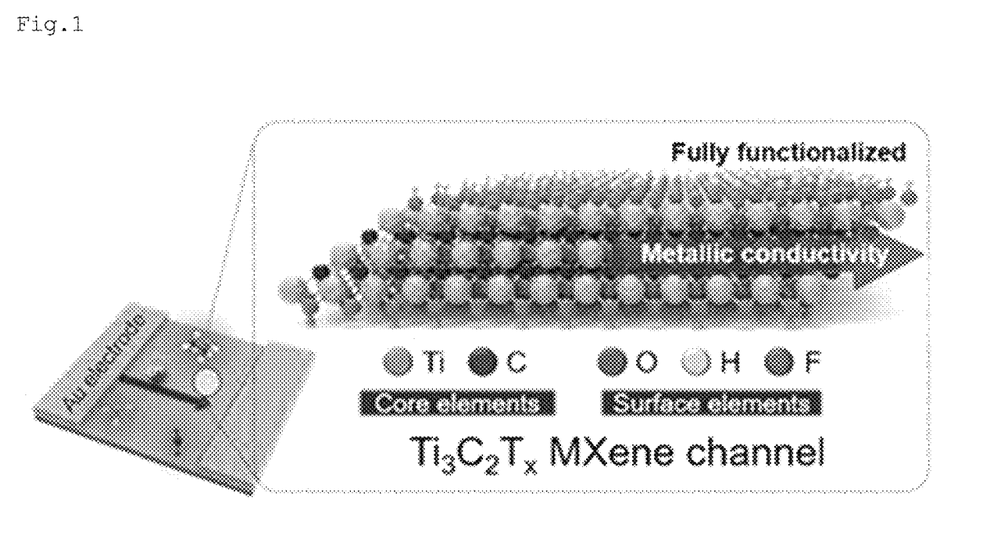
FIG. 1 shows the structure of Ti$_3$C$_2$T$_x$ MXene used for a chemiresistor gas sensor using MXene according to an embodiment of the present invention.

As MXene used in the chemiresistor gas sensor according to an embodiment of the present invention, $Ti_3C_2T_x$ MXene (available from Yury Gogotsi) is adopted, and, as illustrated in FIG. 1, $Ti_3C_2T_x$ MXene is a 2D nano material comprising double elements of a heavy metal atom such as titanium (Ti) and a carbon (C) atom, with a 2D planar structure having a thickness of 1 nm and a length of ones of μm. $Ti_3C_2T_x$ MXene is configured such that many functional groups (O, OH, F, etc.) are distributed on the surface thereof, and the functional groups distributed on the surface thereof are not limited to O, OH, and F, but all chemical functional groups may be distributed on the surface of MXene.

The chemiresistor gas sensor using MXene according to an embodiment of the present invention includes a substrate, an MXene thin film formed on the substrate, and electrodes respectively formed on both sides of the MXene thin film.

The material for the substrate may be selected from the group consisting of glass, $Si/SiO_2$, PET, PDMS, polyimide (PI) and Ecoflex, but is not limited thereto, and any material for typical planar or flexible substrates may be used.

In the present invention, the material for the electrodes may be selected from the group consisting of gold, silver, copper, titanium, carbon nanotubes, graphene and a conductive polymer, but is not limited thereto, and any typical electrode material may be used.

In the present invention, the chemiresistor gas sensor may function to sense at least one gas selected from the group consisting of a volatile organic compound (VOC), nerve gas, explosive gas and food gas.

In the present invention, the VOC may be at least one selected from the group consisting of hexane, toluene, heptane, trimethyl hexane, butanal and hexanal, but is not limited thereto.

In the present invention, the nerve gas may be at least one selected from the group consisting of triethylamine, tabun gas, sarin gas, soman gas, cyclosarin gas, VX gas, and novichok gas, but is not limited thereto.

In the present invention, the explosive gas may be at least one selected from the group consisting of nitrogen dioxide ($NO_2$), ammonia ($NH_3$), and 2,4,6-trinitrotoluene, but is not limited thereto.

In the present invention, the food gas may be at least one selected from the group consisting of carbon dioxide, carbon monoxide, and methane, but is not limited thereto.

Figure 2:
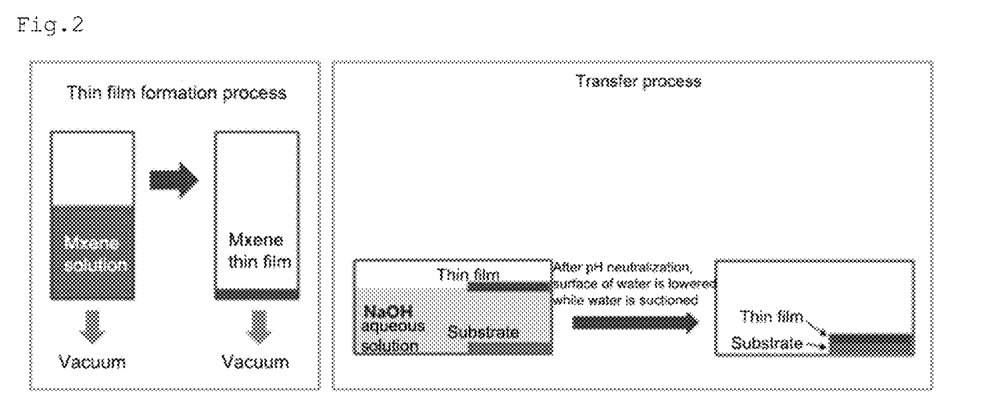
FIG. 2 shows the formation of an MXene thin film and the transfer of the formed thin film onto a sensor substrate in the chemiresistor gas sensor using MXene according to an embodiment of the present invention.

FIG. 2 shows the formation of an MXene thin film and the transfer of the formed thin film onto a sensor substrate in the chemiresistor gas sensor using MXene according to an embodiment of the present invention.

Specifically, in order to form the $Ti_3C_2T_x$ MXene thin film for use in a chemiresistor gas sensor, a vacuum filtration process, a spin-coating process or a spray-coating process may be performed, but the present invention is not limited thereto.

Forming the $Ti_3C_2T_x$ MXene thin film on an anodized aluminum oxide (AAO) membrane through vacuum filtration is described below.

In order to form the $Ti_3C_2T_x$ MXene thin film, the $Ti_3C_2T_x$ MXene is first dispersed in $H_2O$ to give a $Ti_3C_2T_x$ MXene aqueous solution. The mixing ratio of the $Ti_3C_2T_x$ MXene aqueous solution is preferably 0.001-0.1 mg/ml.

The vacuum filtration process, which is performed in a vacuum, allows the solvent of the $Ti_3C_2T_x$ MXene aqueous solution placed on a porous membrane to flow downwards through the porous membrane. Specifically, the solvent flows downwards through the porous membrane and the solute $Ti_3C_2T_x$ MXene particles are left behind on the porous substrate, thus forming a thin film. Here, a vacuum is applied, thereby facilitating the movement of the solvent.

Since the force of the vacuum applied under the porous membrane is strong and is uniformly applied over the entire area of the porous membrane, the $Ti_3C_2T_x$ MXene particles are uniformly dispersed in the aqueous solution, and are formed into a thin film having a uniform thickness after vacuum filtration. The means for moving the solvent downwards is not limited to a vacuum.

After the formation of the $Ti_3C_2T_x$ MXene thin film, the formed $Ti_3C_2T_x$ MXene thin film is dried.

In an embodiment of the present invention, AAO is used as the porous membrane for vacuum filtration, but this is merely exemplary, and a porous membrane, such as polycarbonate (PC), polyvinylidene fluoride (PVDF), etc., may be used in addition to AAO, but the present invention is not limited thereto. For reference, AAO facilitates the transfer of the $Ti_3C_2T_x$ MXene thin film onto the sensor substrate.

The $Ti_3C_2T_x$ MXene thin film formed on AAO is transferred onto the sensor substrate, thereby completing the process of manufacturing the chemiresistor gas sensor using MXene.

Transferring the $Ti_3C_2T_x$ MXene thin film formed on AAO onto the sensor substrate is specified below.

Specifically, a NaOH aqueous solution is placed in a container, and the AAO substrate having the $Ti_3C_2T_x$ MXene thin film formed thereon floats on the surface of the NaOH aqueous solution. When the AAO substrate completely dissolves and disappears, only the $Ti_3C_2T_x$ MXene thin film is left behind on the surface of the NaOH aqueous solution. Here, the concentration of the NaOH aqueous solution is preferably 1 to 4 M.

Thereafter, the aqueous solution is neutralized, and the sensor substrate is fixed to the bottom of the container, after which the thin film is transferred onto the substrate while the surface of the aqueous solution is gradually lowered.

As the sensor substrate onto which the $Ti_3C_2T_x$ MXene thin film is to be transferred, a silicon wafer coated with an oxide film ($SiO_2/Si$) is typically used. Theoretically, any substrate having electrical insulation properties and a uniform surface may be used.

The $Ti_3C_2T_x$ MXene thin film according to the present invention is able to sense gas to a limit of detection (LOD) enabling gas detection of 50 ppb (parts per billion).

Also, the chemiresistor gas sensor using $Ti_3C_2T_x$ MXene according to the present invention exhibits low electrical noise and good response compared to conventional sensors, and thus the signal-to-noise ratio thereof is at least tens of times as high. Thereby, the chemiresistor gas sensor using MXene according to the present invention can be confirmed to possess very high sensitivity.

Specifically, the chemiresistor gas sensor using MXene according to the present invention may manifest a signal-to-noise ratio (SNR) of 230 or more for acetone, 345 or more for ethanol, 150 or more for ammonia, and 170 or more for propanol.

The chemiresistor gas sensor according to the present invention is capable of sensing various gas components including VOCs, as well as the above-listed acetone, ethanol, and ammonia, and the SNR may increase to 500~1000 depending on the gas response.

With reference to FIGS. 3 to 11, the chemiresistor gas sensor using MXene according to an embodiment of the present invention and conventional gas sensors manufactured using existing 2D materials (BP (black phosphorus), $MoS_2$ (molybdenum disulfide), and RGO (reduced graphene oxide)) are compared, and the properties of the chemiresistor gas sensor using MXene according to the present invention are described below.

Example. Manufacture of Chemiresistor Gas Sensor Using $Ti_3C_2T_x$ MXene Thin Film In order to form a $Ti_3C_2T_x$ MXene thin film, $Ti_3C_2T_x$ MXene is dispersed in $H_2O$ to give a $Ti_3C_2T_x$ MXene aqueous solution. The mixing ratio of the $Ti_3C_2T_x$ MXene aqueous solution is preferably 0.001-0.1 mg/ml.

Thereafter, the $Ti_3C_2T_x$ MXene aqueous solution is subjected to vacuum filtration on an anodized aluminum oxide (AAO) membrane, thus forming a thin film.

Here, in the vacuum filtration process, which is performed in a vacuum, when a vacuum (having a vacuum pressure of 0.3 atm) is applied under a porous membrane having the $Ti_3C_2T_x$ MXene aqueous solution placed thereon, the solvent flows downwards through the porous membrane and the solute $Ti_3C_2T_x$ MXene particles are left behind on the porous substrate, thereby forming a thin film.

Here, since the force of the vacuum applied under the porous membrane is strong and is uniformly applied over the entire area of the porous membrane, the $Ti_3C_2T_x$ MXene particles are uniformly dispersed in the aqueous solution, and are formed into a thin film having a uniform thickness after vacuum filtration. The $Ti_3C_2T_x$ MXene thin film is formed within 5 min, and in order to completely eliminate water, the formed $Ti_3C_2T_x$ MXene thin film is dried for about 1 hr.

The transfer of the $Ti_3C_2T_x$ MXene thin film formed on AAO onto the sensor substrate is as follows.

Specifically, a 2 M NaOH aqueous solution is placed in a container and the AAO substrate having the $Ti_3C_2T_x$ MXene thin film formed thereon floats on the surface of the NaOH aqueous solution. When the AAO substrate is dissolved and thus removed, the $Ti_3C_2T_x$ MXene thin film floats alone on the surface of the NaOH aqueous solution.

Thereafter, the aqueous solution is replaced several times with distilled water to thus be neutralized, and the sensor substrate is fixed to the bottom of the container, after which the surface of the aqueous solution is gradually lowered and the thin film is placed on the substrate, followed by drying for about 1 hr, thus completing the transfer process.

Used as the sensor substrate onto which the $Ti_3C_2T_x$ MXene thin film is to be transferred was a silicon wafer coated with an oxide film ($SiO_2$/Si).

Comparative Example. Manufacture of Gas Sensor Using BP (Black Phosphorus), $MoS_2$ (Molybdenum Disulfide), RGO (Reduced Graphene Oxide)

In order to form a BP thin film, BP is dispersed in NMP (N-methyl-2-pyrrolidone), thus obtaining a BP solution. The mixing ratio of the BP solution is preferably 0.4 mg/ml. In order to form an $MoS_2$ thin film, $MoS_2$ is dispersed in an ethanol/water mixed solution (ethanol:water volume ratio=45:55), thus obtaining an $MoS_2$ solution. The mixing ratio of the $MoS_2$ solution is preferably 1 mg/ml. In order to form an RGO thin film, RGO is dispersed in ethanol, thus obtaining an RGO solution. The mixing ratio of the RGO solution is preferably 0.05 mg/ml.

Thereafter, each of the BP, $MoS_2$ and RGO solutions is subjected to vacuum filtration on an AAO membrane, thus forming a thin film.

Here, in the vacuum filtration process, which is performed in a vacuum, when a vacuum (having a vacuum pressure of 0.3 atm) is applied under the porous membrane having each of the BP, $MoS_2$ and RGO solutions placed thereon, the solvent flows downwards through the porous membrane and the solute BP, $MoS_2$, RGO particles are left behind on the porous substrate, thus forming a thin film.

Since the force of the vacuum applied under the porous membrane is strong and is uniformly applied over the entire area of the porous membrane, the BP, $MoS_2$ and RGO particles are uniformly dispersed in the aqueous solution, and are formed into respective thin films having a uniform thickness after vacuum filtration. Each of the BP, $MoS_2$ and RGO thin films is formed within 20 min, and in order to completely eliminate the solvent, the formed BP, $MoS_2$ and RGO thin films are dried for about 1 hr.

The transfer of each of the BP, $MoS_2$ and RGO thin films formed on AAO onto the sensor substrate is performed as follows.

Specifically, a 2 M NaOH aqueous solution is placed in a container and the AAO substrate having each of the BP, $MoS_2$ and RGO thin films formed thereon floats on the surface of the NaOH aqueous solution. When the AAO substrate is dissolved and thus removed, each of the BP, $MoS_2$ and RGO thin films floats alone on the surface of the NaOH aqueous solution.

Thereafter, the aqueous solution is replaced several times with distilled water and thus the aqueous solution is neutralized, and the sensor substrate is fixed to the bottom of the container, after which the surface of the aqueous solution is gradually lowered and each thin film is placed on the substrate, followed by drying for about 1 hr, thereby completing the transfer process.

Used as the sensor substrate onto which each of the BP, $MoS_2$ and RGO thin films is to be transferred was a silicon wafer coated with an oxide film ($SiO_2$/Si).

Figure 3:
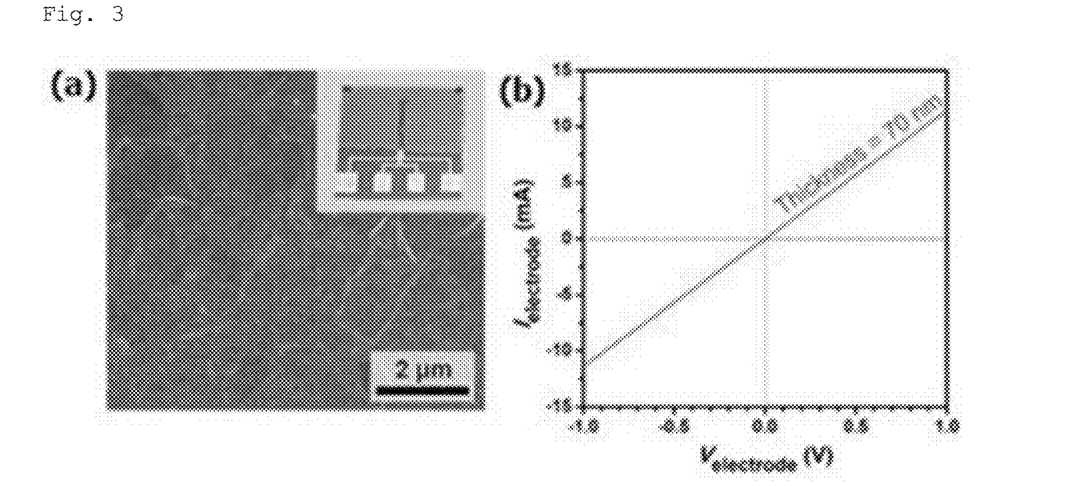
FIG. 3 shows the surface image and the electrical conductivity of the MXene thin film formed on the sensor substrate in the chemiresistor gas sensor using MXene according to an embodiment of the present invention.

FIG. 3 shows the surface image and the electrical conductivity of the MXene thin film formed on the sensor substrate in the chemiresistor gas sensor using the MXene manufactured in Example. As shown in this drawing, the $Ti_3C_2T_x$ MXene thin film is uniformly formed on the sensor substrate, and exhibits very high electrical conductivity.

Figure 4:
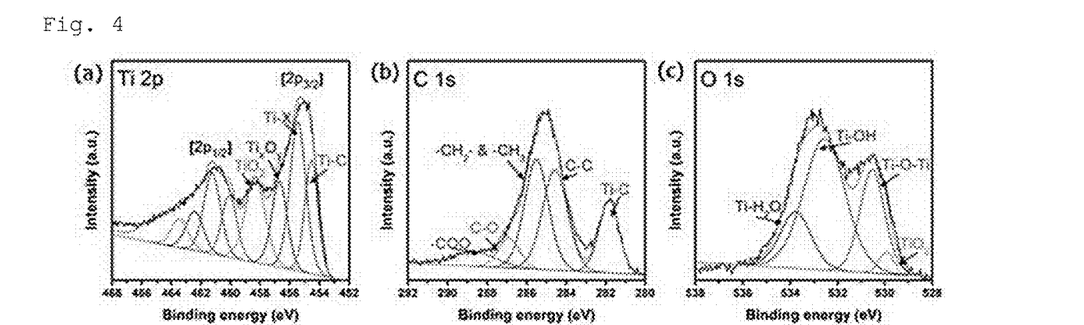
FIG. 4 is of graphs showing the results of analysis of surface functional groups of Ti$_3$C$_2$T$_x$ MXene in the chemiresistor gas sensor using MXene according to an embodiment of the present invention.

FIG. 4 is of graphs showing the results of X-ray photoelectron spectroscopy (XPS) of surface functional groups of $Ti_3C_2T_x$ MXene in the chemiresistor gas sensor using the MXene manufactured in Example. Based on the analysis results, the hydrophilic functional groups are mostly present on the surface of MXene.

Figure 5:
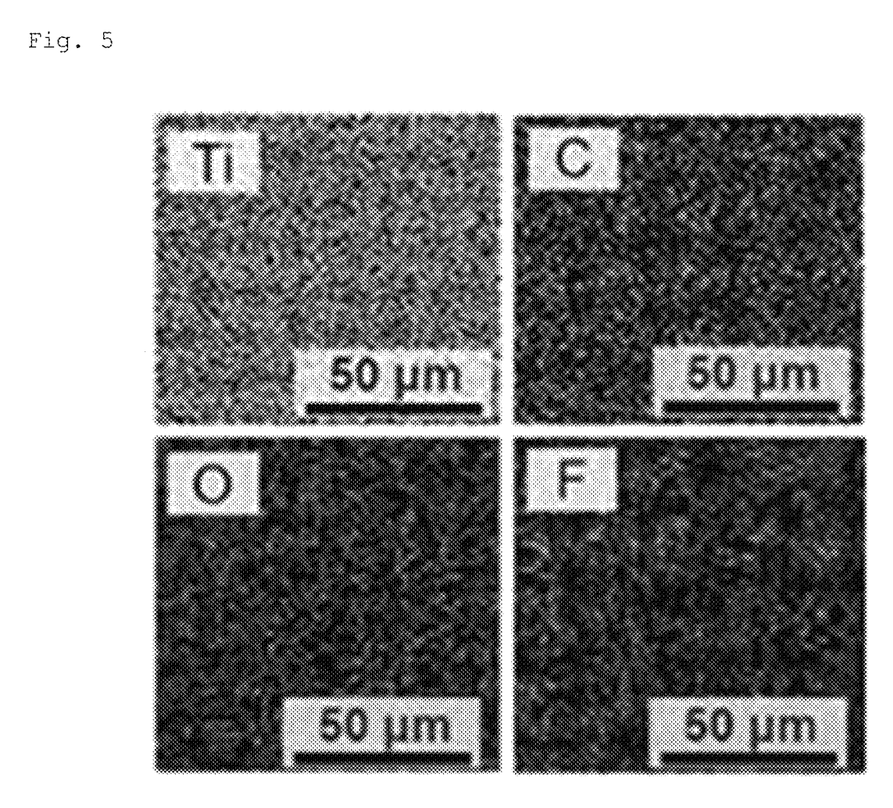
FIG. 5 shows the distribution of individual elements on the MXene thin film through an elemental mapping process in the chemiresistor gas sensor using MXene according to an embodiment of the present invention.

FIG. 5 shows the distribution of individual elements on the MXene thin film through energy-dispersive X-ray spectroscopy (EDS) elemental mapping in the chemiresistor gas sensor using the MXene manufactured in Example. As shown in FIG. 5, four elements, including Ti, C, O, and F, are uniformly distributed over the entire area of the MXene thin film.

Figure 6:
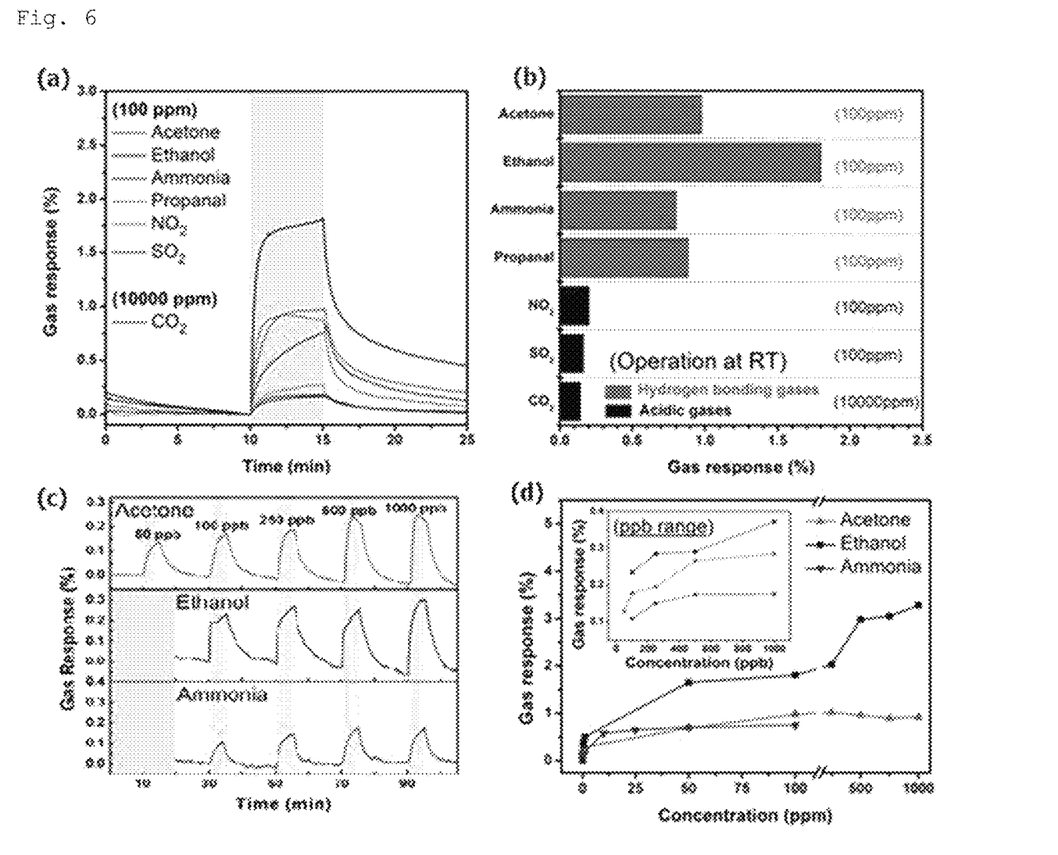
FIG. 6 is a graph showing the results of detection of various substances of the chemiresistor gas sensor using MXene according to an embodiment of the present invention.

FIG. 6 is of graphs showing the results of detection of various substances of the chemiresistor gas sensor using the MXene manufactured in Example. For testing of FIG. 6, typical VOCs, such as acetone, ethanol, ammonia and propanol, were diluted from 1000 ppm to 50 ppb before use.

The curves in the shaded portion of FIG. 6(a) are a graph showing the changes in electrical resistance of the $Ti_3C_2T_x$ MXene thin film in the gas sensor when the gas sensor according to the present invention reacts with each gas, and FIG. 6(b) shows each gas response. As seen in FIGS. 6(a) and (b), the response for typical VOCs (acetone, ethanol, ammonia, propanol) was 1% or more, which is regarded as high compared to acidic gas ($NO_2$, $SO_2$, $CO_2$).

Also, as seen in FIGS. 6(c) and (d), the $Ti_3C_2T_x$ MXene thin film shows clean electrical signals even at a very low concentration of 50 ppb, as in the range of ppm.

Figure 7:
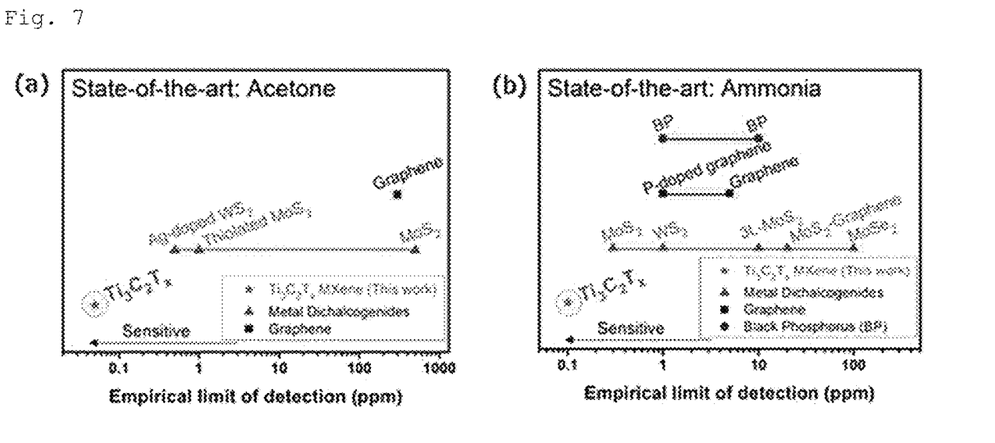
FIG. 7 is a graph showing the results of detection of sensors for measuring acetone and ammonia using conventional BP, MoS$_2$, and RGO.

FIG. 7 shows the limit of detection of the sensors for measuring acetone and ammonia manufactured using BP (black phosphorus), $MoS_2$ (molybdenum disulfide), and RGO (reduced graphene oxide) in Comparative Example, in which the axis x shows the limit of detection. As shown in this drawing, the limit of detection of the gas sensor using $Ti_3C_2T_x$ MXene can be found to exceed the limit of detection of conventional sensors using BP, $MoS_2$ and RGO.

The $Ti_3C_2T_x$ MXene thin film of the present invention is able to realize gas detection even in the range of LOD of 50 ppb (parts per billion).

In order to evaluate the performance thereof, the chemiresistor gas sensor using $Ti_3C_2T_x$ MXene according to the present invention was compared with that of conventional sensors using existing 2D materials, such as BP, $MoS_2$ and RGO.

Figure 8:
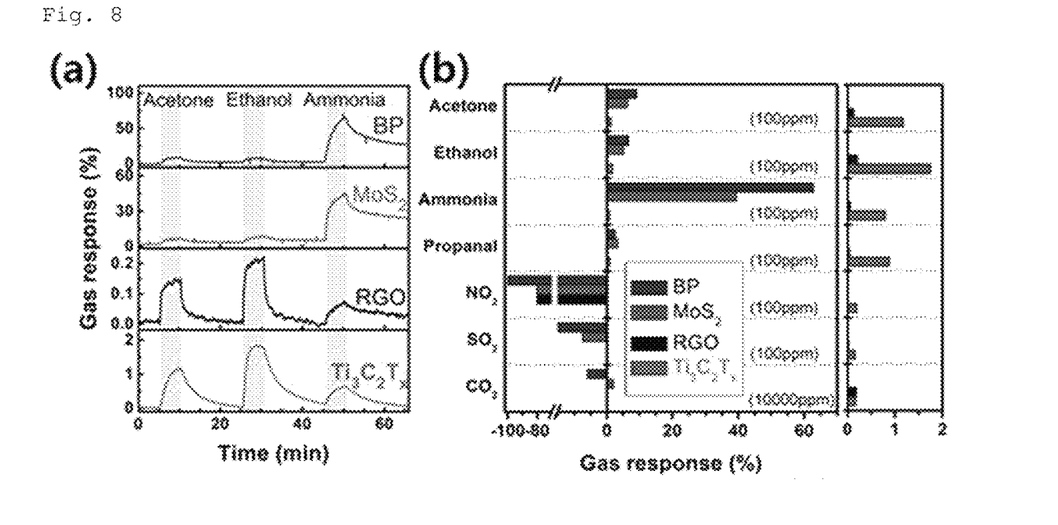
FIG. 8 shows signals that appear when the chemiresistor gas sensor using MXene according to an embodiment of the present invention and the conventional 2D material-based gas sensors react with substances.

FIG. 8 shows signals that appear when the chemiresistor gas sensor using MXene manufactured in Example and the conventional 2D material-based gas sensors manufactured in Comparative Example react with substances. Only the chemiresistor gas sensor using $Ti_3C_2T_x$ MXene according to the present invention exhibits a response of 1~2% for main VOCs.

Figure 9:
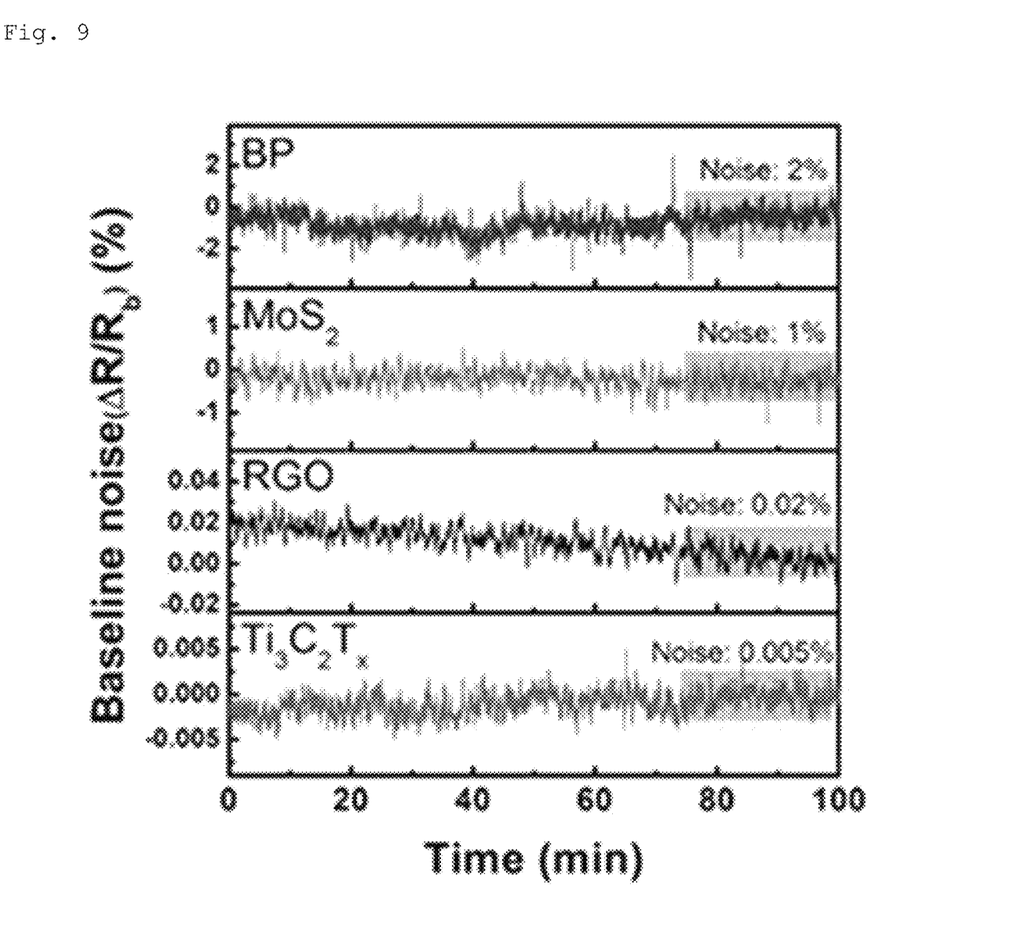
FIG. 9 shows electrical noise of the chemiresistor gas sensor using MXene according to an embodiment of the present invention and the conventional 2D material-based gas sensors.

FIG. 9 shows electrical noise of the chemiresistor gas sensor using MXene manufactured in Example and the conventional 2D material-based gas sensors manufactured in Comparative Example. As shown in this drawing, the chemiresistor gas sensor using $Ti_3C_2T_x$ MXene according to the present invention can be found to exhibit very low electrical noise compared to the conventional sensors.

Figure 10:
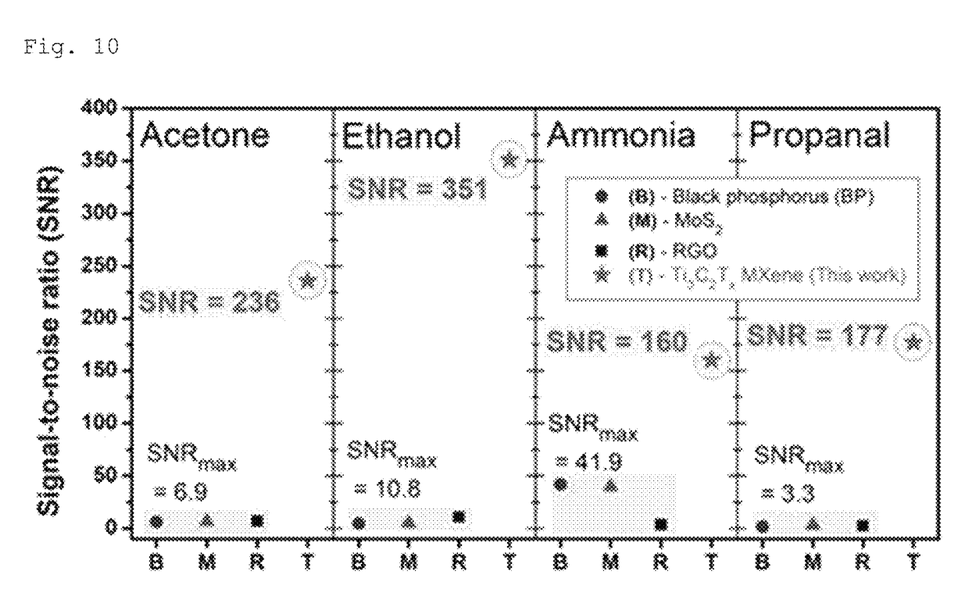
FIG. 10 shows the signal-to-noise ratio (SNR) of the chemiresistor gas sensor using MXene according to an embodiment of the present invention and the conventional 2D material-based gas sensors.

FIG. 10 shows the signal-to-noise ratio (SNR) of the chemiresistor gas sensor using MXene manufactured in Example and the conventional 2D material-based gas sensors manufactured in Comparative Example. The gas sensors using BP, $MoS_2$ and RGO manifested the maximum SNR ranging from 6.9 to 41.9 for acetone, ethanol, ammonia and propanol, but the chemiresistor gas sensor using $Ti_3C_2T_x$ MXene according to the present invention had a SNR ranging from 160 to 351. Specifically, the gas sensor of the present invention shows an SNR as high as about 34 times for acetone, about 33 times for ethanol, about 4 times for ammonia, and 54 times for propanol, compared to the conventional gas sensors using BP, $MoS_2$ and RGO.

Therefore, the chemiresistor gas sensor using $Ti_3C_2T_x$ MXene according to the present invention can exhibit low electrical noise and good response and thus an SNR at least tens of times as high as conventional sensors, whereby the chemiresistor gas sensor using MXene has very high sensitivity.

Figure 11:
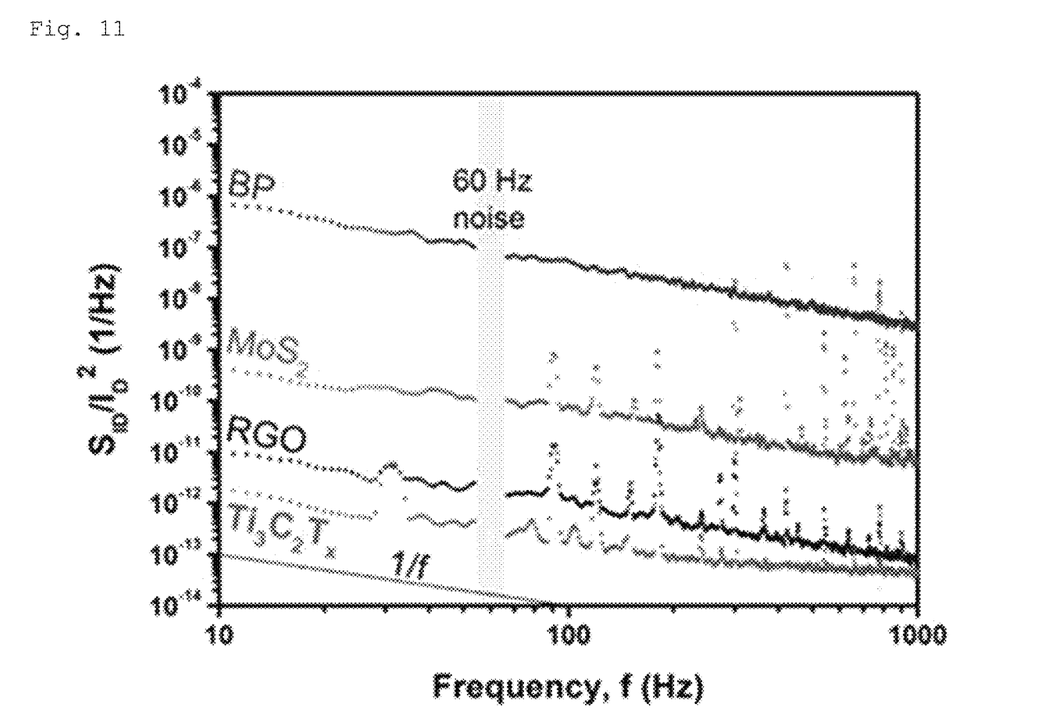
FIG. 11 shows the test data for measuring intrinsic electrical noise of each material, in addition to noise that appears upon sensor measurement in the chemiresistor gas sensor using MXene according to an embodiment of the present invention and the conventional 2D material-based gas sensors.

FIG. 11 shows the test data for measuring the intrinsic electrical noise of each material, in addition to the noise that appears upon sensor measurement in the chemiresistor gas sensor using MXene manufactured in Example and the conventional 2D material-based gas sensors manufactured in Comparative Example, and specifically the data of testing performed to measure the intrinsic electrical noise of each material in addition to the noise that appears upon sensor measurement.

The intrinsic noise may be measured based on $S(ID)/ID^2$ depending on the frequency, $S(ID)$ showing noise power spectral density and $I(D)$ showing current. Since the $S(ID)/I(D)^2$ of the chemiresistor gas sensor using $Ti_3C_2T_x$ MXene is the lowest, the intrinsic electrical noise thereof is regarded as very low. This is considered to be due to the high electrical conductivity of the material.

Although the preferred embodiments of the present invention have been disclosed for illustrative purposes with reference to the accompanying drawings, those skilled in the art will appreciate that various modifications and equivalents are possible, without departing from the scope and spirit of the invention as disclosed in the accompanying claims. Therefore, the scope of the present invention should be determined by the accompanying claims.

INDUSTRIAL APPLICABILITY

The present invention pertains to a gas sensor using MXene having excellent electrical conductivity as a channel material, suitable for use in fields in which it is necessary to sensitively detect very low concentrations of molecules, such as in the detection of toxic substances, detection of pollutants, early diagnosis of diseases, etc.

The invention claimed is:
1. A chemiresistor gas sensor, comprising:
a substrate;
an MXene thin film comprising imbedded $Na^+$ ions formed on an aluminum oxide membrane formed on the substrate; and
electrodes respectively formed on both sides of the MXene thin film,
wherein,
a limit of detection (LOD) enabling gas detection of the chemiresistor gas sensor is 50 ppb, and
the chemiresistor gas sensor has a signal-to-noise ratio (SNR) of 230 or more for acetone, 345 or more for ethanol, 150 or more for ammonia, and 170 or more for propanol.

2. The chemiresistor gas sensor of claim 1, wherein the MXene thin film is a $Ti_3C_2T_x$ MXene thin film.

3. The chemiresistor gas sensor of claim 1, wherein a chemical functional group is distributed on a surface of the MXene thin film.

4. The chemiresistor gas sensor of claim 3, wherein the chemical functional group of the MXene thin film contains oxygen (O), a hydroxyl ion (OH), and fluorine (F).

5. The chemiresistor gas sensor of claim 1, wherein the substrate is composed of a material selected from the group consisting of glass, $Si/SiO_2$, PET, PDMS, polyimide (PI), and Ecoflex.

6. The chemiresistor gas sensor of claim 1, wherein the electrodes are formed of a material selected from the group consisting of gold, silver, copper, titanium, carbon nanotubes, graphene, and a conductive polymer.

7. The chemiresistor gas sensor of claim 1, wherein the chemiresistor gas sensor is used for sensing at least one gas selected from the group consisting of a volatile organic compound (VOC), nerve gas, explosive gas, and food gas.

8. The chemiresistor gas sensor of claim 1, wherein the MXene thin film has a thickness of 1 nm and a length of ones of μm.

\* \* \* \* \*